United States Patent [19]

Ahmed

[11] 4,019,071
[45] Apr. 19, 1977

[54] BIASING CURRENT ATTENUATOR

[75] Inventor: Adel Abdel Aziz Ahmed, Annandale, N.J.

[73] Assignee: RCA Corporation, New York, N.Y.

[22] Filed: Apr. 12, 1976

[21] Appl. No.: 676,008

[52] U.S. Cl. .......................... 307/296 R; 307/297; 330/22; 330/40
[51] Int. Cl.² ........................................ H03K 17/00
[58] Field of Search ............... 307/296, 297, 303; 330/22, 23, 381, 9, 40

[56] References Cited

UNITED STATES PATENTS

| 3,651,346 | 3/1972 | Limberg | 330/22 |
| 3,921,013 | 11/1975 | Ahmed | 307/296 |

Primary Examiner—Stanley D. Miller, Jr.
Assistant Examiner—B.P. Davis
Attorney, Agent, or Firm—H. Christoffersen; S. Cohen; A. L. Limberg

[57] ABSTRACT

A potential offset is developed across a self-biased transistor responsive to applied input current. This offset potential has a decrement subtracted therefrom by a network comprising an intermediate transistor and a pair of resistors; this reduced potential provides the base-emitter potential for biasing the base-emitter junction of a transistor supplying output current between its emitter and collector electrodes. Very large current attenuation factors are obtainable with resistors having sufficiently low resistance as to be readily integrable in a monolithic integrated circuit.

9 Claims, 6 Drawing Figures

BIASING CURRENT ATTENUATOR

The present invention relates to biasing current attenuators which are of a type particularly well-suited for inclusion in a monolithic integrated circuit for providing low-valued bias currents.

A problem in monolithic integrated circuit designs is the impracticality of designing with high-value resistances—say, in the range of 50 kilohms upward—particularly when it is desired to avoid the uncertainty of resistance value encountered with so-called "pinch" resistors formed by two successive diffusion steps. At the same time, it is often desirable in integrated circuits to have available supplies of substantially constant current ranging downward in value to the sub-microampere region. From simple Ohm's Law considerations, it is apparent that operating with such low currents presents a problem when high-valued resistances must be eschewed.

Widlar, in U.S. Pat. No. 3,320,439, describes a solution to this problem, as does the present inventor in U.S. Pat. No. 3,921,013, issued Nov. 18, 1975 and entitled "Biasing Current Attenuator" and assigned, like the present application, to RCA Corporation. In these prior art circuits, an output transistor has an emitter-to-base potential ($V_{BE}$) applied to it which is equal to: (a) the $V_{BE}$ of a self-biased input transistor through the emitter-to-collector path of which a relatively high-value input current is caused to flow, minus (b) the potential drop across a dropping resistor in which current substantially equal to the output current through the emitter-to-collector path of the output transistor is caused to flow. The lower $V_{BE}$ of the output transistor causes the output current through its emitter-to-collector path to be of relatively low valued compared to the input current. These prior art circuits have the problem that if one seeks to have very small output current, one must make the dropping resistor larger and larger at a rate far exceeding the rate at which the output current is reduced. So, a law of diminishing returns tends to limit the smallness of output current than can be achieved with resistors capable of being integrated in small area.

The present inventor has found that increased bias current attenuation can be achieved without need for much additional resistance by suitably modifying his previous bias current attenuator to include a further dropping resistor connected between the base and collector electrodes of the intermediate transistor for conducting its collector current. The drop across this further dropping resistor decreases the $V_{BE}$ of the output transistor still further than the $V_{BE}$ of the intermediate transistor and so reduces output current. The current can be reduced further and further with only moderate increase in the resistance of the further dropping resistor, since the current flow through this further dropping resistor is not appreciably decreased as its resistance increases.

FIG. 1 shows a biasing current attenuator having input, common and output terminals $T_1$, $T_2$ and $T_3$, respectively. The operation of each of transistors $Q_1$, $Q_2$ and $Q_3$ is in substantial accordance with the following equation.

$$V_{BE} = (kT/q)ln(I_E/A_{BE}J_S) \qquad (1)$$

Figure 1:
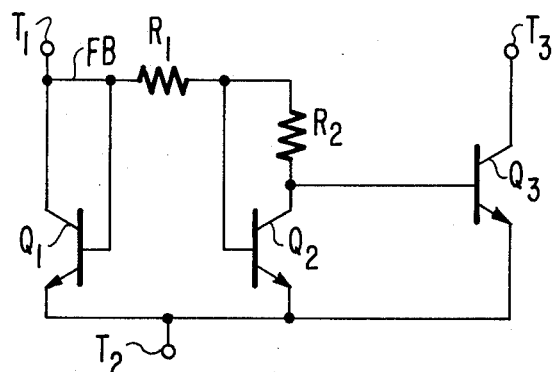
FIGS. 1, 2 and 3 are schematic diagrams of biasing current attenuators that are alternative embodiments of the present invention.

where $V_{BE}$ is the emitter-to-base potential of the transistor;
$k$ is Boltzmann's constant;
$q$ is the charge on an electron;
$T$ is the temperature at which the transistor is operated;
$I_E$ is the emitter current of the transistor;
$A_{BE}$ is the effective area of its base-emitter junction; and
$J_S$ is the value of $I_E/A$ for $V_{BE} = 0$.

$Q_1$, $Q_2$ and $Q_3$ are assumed to have base-emitter junctions with the same impurity profiles and to be operated at substantially the same temperature T so their respective $J_S$'s are equal. At a transistor operating temperature of 300K, ($kT/q$) has a value of 26 millivolts. $V_{BE}$, $I_E$ and $A_{BE}$ will be further subscripted with the identification tag of the transistor to which each pertains. $Q_1$, $Q_2$ and $Q_3$ will be assumed to be good-quality transistors such that their respective base currents $I_{BQ1}$, $I_{BQ2}$ and $I_{BQ3}$ are negligibly small compared to their collector currents $I_{CQ1}$, $I_{CQ2}$ and $I_{CQ3}$, respectively. This causes the respective collector currents $I_{CQ1}$, $I_{CQ2}$ and $I_{CQ3}$ to be substantially equal to the respective emitter current $I_{EQ1}$, $I_{EQ2}$ and $I_{EQ3}$. From equation 1, the following equations can be drawn.

$$V_{BEQ1} - V_{BEQ2} = (kT/q)ln(I_{EQ1}A_{BEQ2}/I_{EQ2}A_{BEQ1}) \qquad (2)$$

$$V_{BEQ2} - V_{VEQ3} = (kT/q)ln(I_{EQ2}A_{BEQ3}/I_{EQ3}A_{BEQ2}) \qquad (3)$$

Equations 4 and 5 following are derived from Ohm's Law, where $R_1$ and $R_2$ are the respective resitances of resistors $R_1$ and $R_2$.

$$V_{BEQ1} - V_{BEQ2} = (I_{BQ2} + I_{CQ2} + I_{BQ3})R_1 \qquad (4)$$

$$V_{BEQ2} - V_{BEQ3} = (I_{CQ2} + I_{BQ3})R_2 \qquad (5)$$

Equations 4 and 5 may be reduced to the following close approximations 6 and 7, respectively.

$$V_{BEQ1} - V_{BEQ2} \cong I_{EQ2}R_1 \qquad (6)$$

$$V_{BEQ2} - V_{BEQ3} \cong I_{EQ2}R_2 \qquad (7)$$

Substituting between equations 2 and 6 and between equations 3 and 7 yields expressions 8 and 9, following, for $R_1$ and $R_2$.

$$R_1 = (kT/q\ I_{EQ2})ln(I_{EQ1}A_{BEQ2}/I_{EQ2}A_{BEQ1}) \qquad (8)$$

$$R_2 = (kT/q\ I_{EQ2})ln(I_{EQ2}A_{BEQ3}/I_{EQ3}A_{BEQ2}) \qquad (9)$$

Adding equations 8 and 9 yields equation 10 following.

$$(R_1 + R_2) = (kT/q\ I_{EQ2})ln(I_{EQ1}A_{BEQ3}/I_{EQ3}A_{BEQ1}) \qquad (10)$$

For a desired relationship of $I_{EQ1}$ and $I_{EQ3}$, which currents are substantially equal respectively to the input current supplied to $T_1$ and to the output current demanded at $T_3$, $I_{EQ2}$ can be chosen with a value between $I_{EQ1}$ and $I_{EQ3}$ that will place $R_1 + R_2$ at any convenient resistance level.

For example, suppose $A_{BEQ1} = A_{BEQ2} = A_{BEQ3}$ and that it is desired to accommodate an input current of about 1 milliampere (1000 microamperes) and to respond with an output current of about 100 nanoamperes. $R_1 + R_2$ is to be in the 2000 ohm range. The input current has to be reduced 10,000 times; and, since at a transistor operating temperature of 300K, $(kT/q)$ is 26 millivolts, $(kT/q)$ $(I_{EQ1}A_{BEQ3}/I_{EQ3}A_{BEQ1})$ is 240 millivolts. Solving equation 10 for $I_{EQ2}$, 240 millivolts divided by 2000 ohms yields a value of 120 microamperes. Knowing $I_{EQ2}$, equations 8 and 9 can be solved to find $R_1$ and $R_2$ respectively. $R_1$ will equal $(kT/q) = 26mv$ divided by $I_{EQ2} = 120$ $\mu a$, quantity times $ln(1ma/120\mu a) = 2.12$ —i.e., 460Ω—so $R_2$ will equal 1540 Ω. The input current to terminal $T_1$ will actually be equal to $I_{EQ1}$, 1000$\mu a$, plus a current substantially equal to $I_{EQ2}$, 120$\mu a$—i.e., 1120$\mu a$.

The ratio of $R_2$ to $R_1$ in the example above is about 4 to 1, which is a comfortable resistance ratio for monolithic integrated circuit construction. Indeed, by assuming $R_2 = 4R_1$ in equation 9 and cross-solving it with equation 1 to eliminate $R_1$, one can obtain a value of $I_{EQ2}$ (150$\mu a$) that substituted back into equations 8 and 9 yields an $R_1$ (303Ω) and an $R_2$ (1210Ω) in exact 1:4 ratio.

Returning to the original design example, note that $R_1 + R_2$ of 2000Ω is about 1200 times lower in resistance than $R_1$ alone would have to be were $R_2$ replaced by direct connection as described in U.S. Pat. No. 3,320,439, requiring the 240 millivolt difference between $V_{BEQ1}$ and $V_{BEQ3}$ to be developed by $R_1$ conducting a current equal to output current—i.e., 100 nanoamperes. $R_1$ would have to have a resistance of 2.4 megohms in the prior art circuit, which is not a value that can be reproducibly integrated by presently known techniques.

The bias current attenuators of U.S. Pat. No. 3,320,439 and 3,921,013 each exhibit an output current substantially logarithmically related to input current; as input current increases, output current also increases, though the increase it less pronounced. Bias current attenuators embodying the present invention, however, exhibit an input current with less than logarithmic increase over a lower range of increasing input current, and with decrease over a higher range of increasing input current. Often, this characteristic can be utilized to obtain more constant output current for a given range of input current level than could be obtained by the prior art attenuators. In a design in which constancy of output current level is the most important consideration, more latitude has to be permitted in the choice of $R_1 + R_2$. Since equations 8, 9 and 10 are non-linear, the best design procedure is to generate families of graphs describing a range of designs, each graph plotting normalized values of $R_1$ and $R_2$ versus attenuation of normalized input current for a given range of input current variations, and then to choose an appropriate design for one's particular needs.

Figure 2:
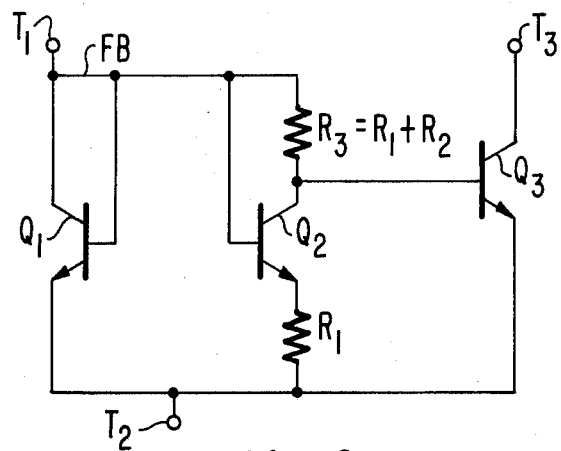

FIG. 2 shows an alternative configuration for the FIG. 1 biasing current attenuator. The FIG. 2 configuration is especially useful where constancy of output current despite variation of input current is sought, but in which it is not desired to reduce the output current many, many times below minimum input current. This, because one can simulate operation of the FIG. 1 circuit with a negative value of $R_2$ if the absolute value of $R_1$ be less than that of $R_2$. For example, in one design using the FIG. 2 configuration, $R_1 = 2000Ω$, $R_3 = 1140Ω$ simulating an $R_2$ of $-1860Ω$. This circuit provides performance as tabulated below, $I_{IN}$ being the current applied to terminal $T_1$ and $I_{OUT}$ being the current demanded at terminal $T_3$.

| $I_{IN}$ | 10$\mu a$ | 30$\mu a$ | 100$\mu a$ | 300$\mu a$ | 1ma | 3ma | 10ma |
|---|---|---|---|---|---|---|---|
| $I_{OUT}$ | 4.3$\mu a$ | 6.2$\mu a$ | 7.8$\mu a$ | 8.5$\mu a$ | 8.0$\mu a$ | 7.2$\mu a$ | 6.0$\mu a$ |

$I_{OUT}$ varies over only a 2:1 range despite $I_{IN}$ ranging over a 1000:1 range.

Figure 3:
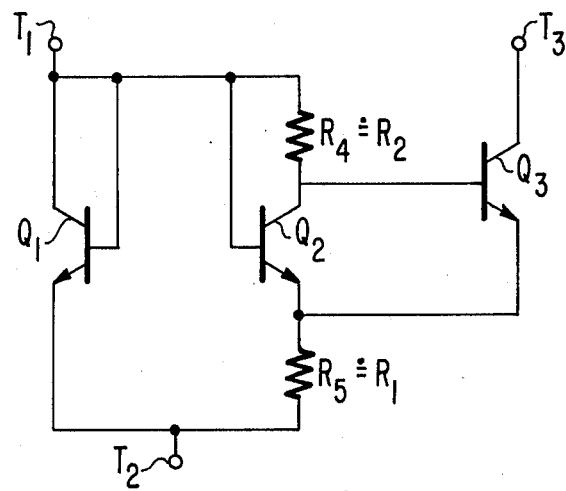

FIG. 3 shows another alternative configuration for the FIG. 1 biasing current attenuator, which, if $R_4$ and $R_5$ are substantially equal respectively to $R_1$ and to $R_2$, behaves very much like the FIG. 1 biasing current attenuator, if $I_{EQ2}$ be substantially greater than $I_{EQ3}$, and somewhat less so, if $I_{EQ2}$ be only a few times as large as $I_{EQ3}$.

One may use a variety of direct-coupling networks to replace the direct connection FB between collector and base electrodes of $Q_1$ in any one of the FIGS. 1, 2 and 3 bias current attenuators to provide $Q_1$ direct-coupled collector-to-base feedback to regulate $V_{BEQ2}$. For example, a common collector transistor amplifier may be used, in which case $I_{EQ2}$ will not appear as a component of the input current to $T_1$. Transistors $Q_1$, $Q_2$ and $Q_3$ may comprise similar certain well known composite transistor configurations each comprising a plurality of transistors—e.g., Darlington configurations.

Figure 4:
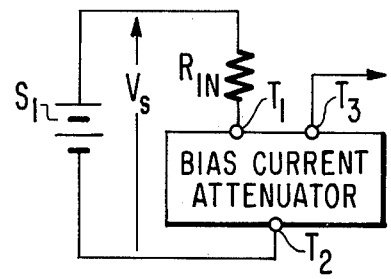
FIGS. 4, 5 and 6 are schematic diagrams, each partially in block form, showing representative input circuit connections of these biasing current attenuators.
Figure 5:
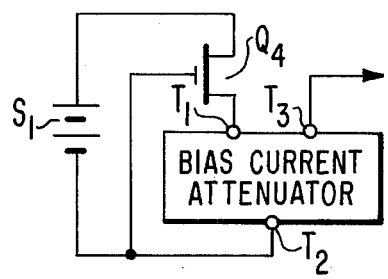
Figure 6:
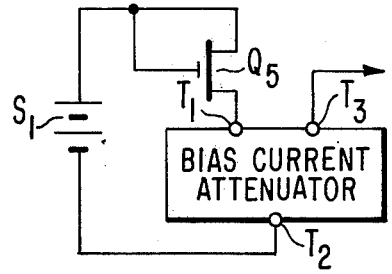

FIGS. 4, 5 and 6 illustrate different, representative means for applying input current to a bias current attenuator of the sort shown in FIGS. 1, 2 or 3. In FIG. 4, input current flow through resistor $R_{IN}$ to $T_1$ is determined according to Ohm's Law by the potential drop across $R_{IN}$—i.e., the potential $V_S$ supplied by supply S minus $V_{BEQ1}$—divided by the resistance of $R_{IN}$. In FIG. 5, depletion-type n-channel field-effect transistor $Q_4$ is arranged to supply substantially constant input current to $T_1$; and in FIG. 6, depletion-type p-channel field effect transistor $Q_5$ is so arranged. The bias current attenuator may advantageously be designed for constancy of output current in these configurations to make allowance for variations in the conductance characteristics of $R_1$, the channel of $Q_4$ or the channel of $Q_5$.

What is claimed is:
1. A biasing current attenuator comprising:
   first, second and third terminals, said first and second terminals for accepting applied input current, said first and third terminals for suppling output current;
   first, second and third transistors of the same conductivity type, each having base and emitter electrodes with a base-emitter junction therebetween and having a collector electrode, the emitter and collector electrodes of said first transistor being connected to said first and said second terminals, respectively, the collector electrode of said third transistor being connected to said third terminal;
   a direct coupled collector-to-base feedback connection for said first transistor, whereby the emitter-to-base potential of said first transistor is regulated to condition said first transistor for conducting most of said input current between its collector and emitter electrodes;

a first resistive element connected to the base-emitter junction of said second transistor to form a serial combination therewith;

means for applying the base-emitter potential of said first transistor to said serial combination in a sense to forward-bias the base-emitter junction of said second transistor;

a second resistive element connected at one end to the base electrode of said second transistor and at the other end to the collector electrode of said second transistor and the base electrode of said third transistor; and means connecting the emitter electrode of said third transistor to the emitter electrode of at least one of said first and said second transistors.

2. A biasing current attenuator as set forth in claim 1 wherein the last-named means consists of direct connections without substantial intervening resistances of the emitter electrode of said third transistor to the emitter electrodes of said first and said second transistors.

3. A biasing current attenuator as set forth in claim 1 wherein said last-named means consists of a direct connection without substantial intervening resistance between the emitter electrodes of said first and said third transistors.

4. A biasing current attenuator as set forth in claim 1 wherein said last-named means consists of a direct connection without substantial intervening resistance between the emitter electrodes of said third and said second transistors.

5. A biasing current attenuator as set forth in claim 1 in combination with means for supplying said input current that comprises:

resistance means; and means for supplying a potential connected in series with said resistance means between said first and second terminals.

6. A biasing current attenuator comprising:

first, second and third terminals, said first and second terminals for accepting applied input current, said first and third terminals for supplying output current;

first, second and third transistors of the same conductivity type, each having base and emitter electrodes with a base-emitter junction therebetween and having a collector electrode, the emitter and collector electrodes of said first transistor being connected to said first and said second terminals, respectively, the collector electrode of said third transistor being connected to said third terminal;

a direct coupled collector-to-base feedback connection for said first transistor, whereby the emitter-to-base potential of said first transistor is regulated to condition said first transistor for conducting most of said input current between its collector and emitter electrodes;

a first resistive element having a first end connected to one of the base and emitter electrodes of said second transistor and having a second end;

means for applying the base-emitter potential of said first transistor between the second end of said first resistive element and the other of the base and emitter electrodes of said second transistor in a sense to forward-bias the base-emitter junction of said second transistor;

a second resistive element connected at one end to the base electrode of said second transistor and at the other end to the collector electrode of said second transistor and the base electrode of said third transistor; and means connecting the emitter electrode of said third transistor to the emitter electrode of at least one of said first and said second transistors.

7. A biasing current attenuator comprising:

a semiconductor junction;

means for applying a current in the forward direction through said semiconductor junction for developing a potential across said semiconductor junction;

a first resistor;

a resistor-transistor combination having first and second terminals and a circuit therebetween in a series connection with said first resistor, said resistor-transistor combination including a first transistor having an emitter electrode connected to said first terminal, a base electrode connected to said second terminal, and a collector electrode, and a second resistor connected between said collector electrode and said second terminals;

means for applying the potential developed across said semiconductor junction across said series connection in a sense to cause self-biased current flow through said first transistor; and a second transistor having a base-emitter junction connected in the forward direction between the collector electrode of said first transistor and a point in said series connection which includes between it and said collector electrode the collector-to-emitter path of said first transistor.

8. A biasing current attenuator as set forth in claim 7 wherein the emitter-to-collector potential of said first transistor is applied directly across the base-emitter junction of said second transistor.

9. A biasing current attenuator as set forth in claim 7, said first resistor being connected at one end to the emitter electrode of said first transistor, and the base emitter junction of said second transistor being connected between the other end of said first resistor and said collector electrode.

* * * * *